United States Patent
Yamamoto

(10) Patent No.: US 10,551,650 B2
(45) Date of Patent: Feb. 4, 2020

(54) MANUFACTURING METHOD OF LIQUID CRYSTAL DISPLAY DEVICE

(71) Applicant: Panasonic Liquid Crystal Display Co., Ltd., Himeji-shi, Hyogo (JP)

(72) Inventor: Makoto Yamamoto, Hyogo (JP)

(73) Assignee: Panasonic Liquid Crystal Display Co., Ltd., Hyogo (JP)

( * ) Notice: Subject to any disclaimer, the term of this patent is extended or adjusted under 35 U.S.C. 154(b) by 0 days.

(21) Appl. No.: 15/940,404

(22) Filed: Mar. 29, 2018

(65) Prior Publication Data

US 2018/0284524 A1  Oct. 4, 2018

(30) Foreign Application Priority Data

Mar. 29, 2017  (JP) ................. 2017-065238

(51) Int. Cl.
*H01L 27/12* (2006.01)
*G02F 1/1333* (2006.01)
*G02F 1/1345* (2006.01)
*G02F 1/1368* (2006.01)
*G02F 1/1343* (2006.01)

(52) U.S. Cl.
CPC ...... *G02F 1/133305* (2013.01); *G02F 1/1368* (2013.01); *G02F 1/13458* (2013.01); *H01L 27/1218* (2013.01); *H01L 27/1266* (2013.01); *G02F 1/134363* (2013.01); *G02F 2001/133354* (2013.01); *G02F 2001/133368* (2013.01)

(58) Field of Classification Search
CPC ... H01L 27/12; H01L 27/1266; H01L 27/124; H01L 27/1218; H01L 27/3267; H01L 27/3286; G02F 1/1333; G02F 1/1368; G02F 1/1345; G02F 1/133305; G02F 1/134363; G02F 1/13458; G02F 2001/133354; G02F 2001/133368
USPC ........................................................... 438/30
See application file for complete search history.

(56) References Cited

U.S. PATENT DOCUMENTS

| | | | | |
|---|---|---|---|---|
| 2007/0278513 | A1* | 12/2007 | Chikugawa | H01L 33/54 257/100 |
| 2014/0084426 | A1* | 3/2014 | Kiyota | H01L 23/544 257/620 |
| 2014/0353637 | A1* | 12/2014 | Kawata | H01L 27/3272 257/40 |
| 2016/0133592 | A1* | 5/2016 | Okumura | H01L 24/03 |
| 2017/0301860 | A1* | 10/2017 | Yamazaki | H01L 27/3258 |

FOREIGN PATENT DOCUMENTS

JP  2004-118135  4/2004

\* cited by examiner

*Primary Examiner* — Chuong A Luu
(74) *Attorney, Agent, or Firm* — Hamre, Schumann, Mueller & Larson, P.C.

(57) ABSTRACT

A manufacturing method of a liquid crystal display device including a first substrate and a second substrate each including a flexible board, the manufacturing method includes a first step of forming the flexible board by forming, in a first region on a glass substrate, a first resin unit made of a first resin having a property of absorbing infrared light and forming, in a second region on the glass substrate, a second resin unit made of a second resin smaller in infrared absorptivity than the first resin; and a second step of, subsequent to the first step, irradiating the first resin unit with infrared light to cut a portion corresponding to the first region in the flexible board.

11 Claims, 15 Drawing Sheets

FIG.3
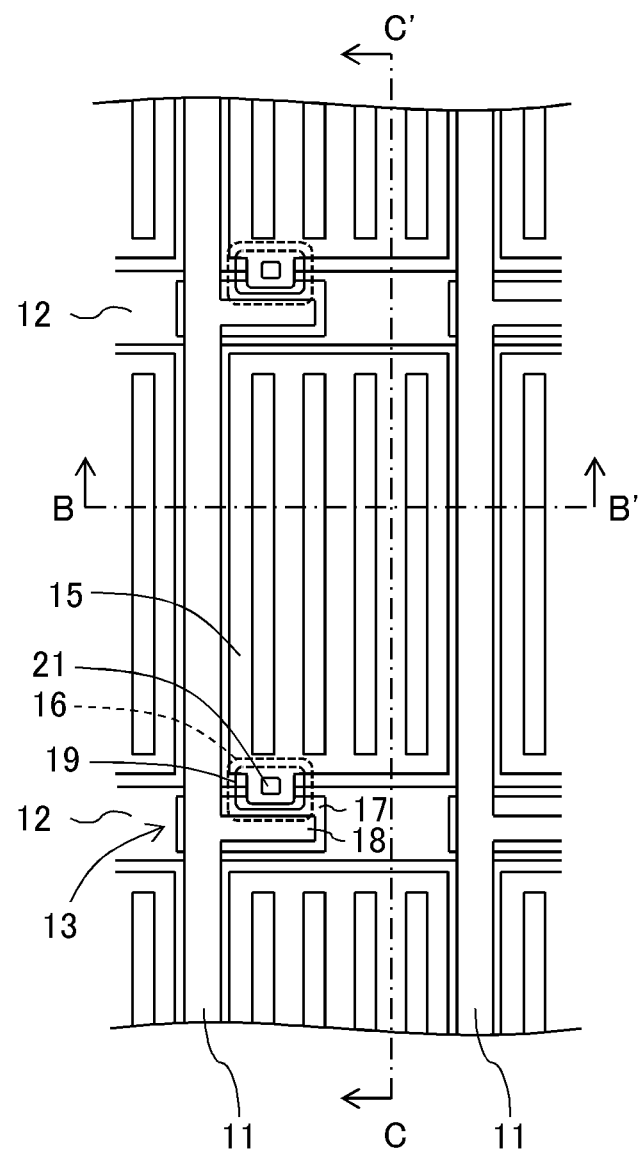
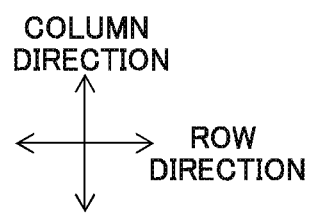

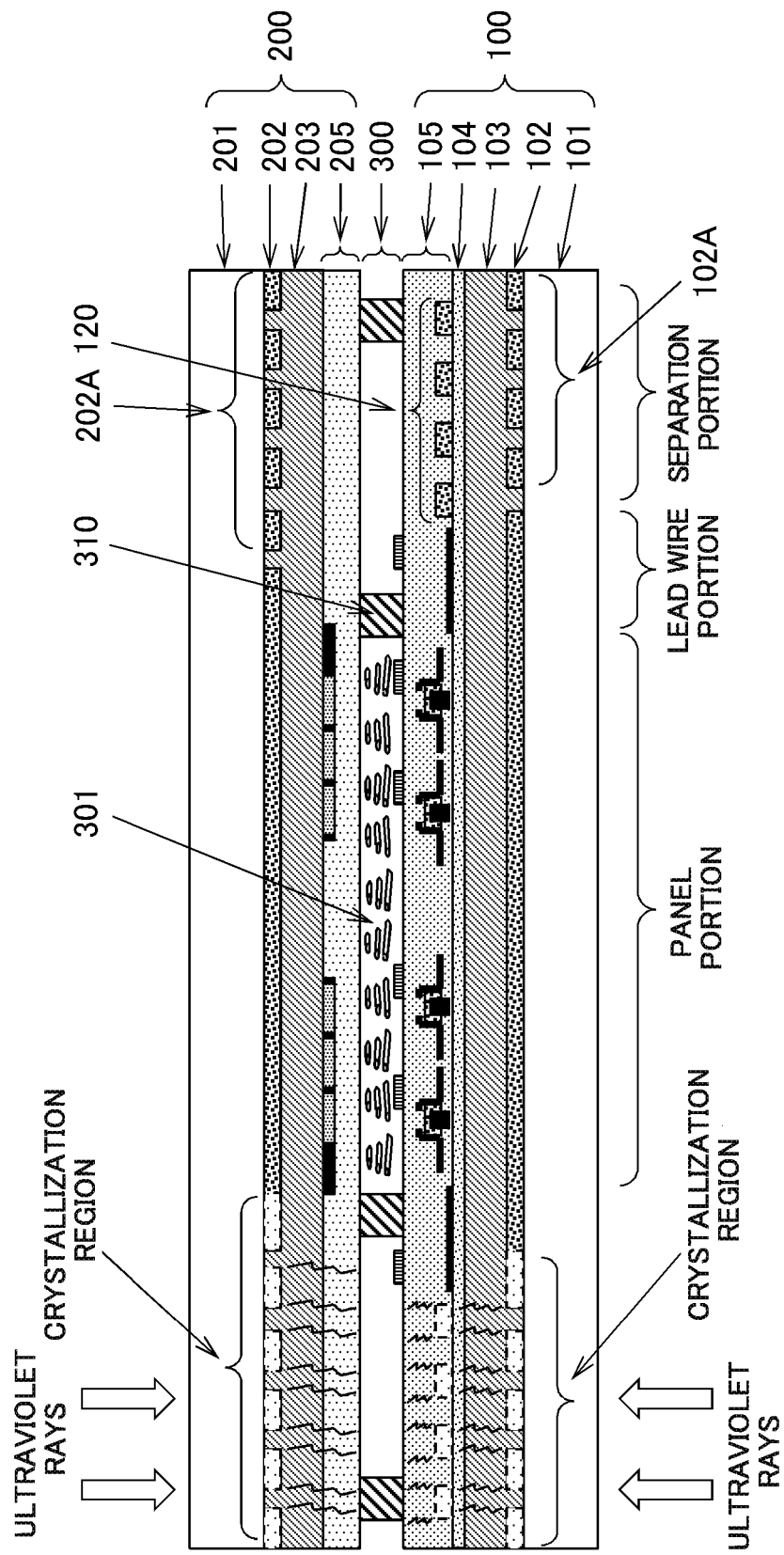

MANUFACTURING METHOD OF LIQUID CRYSTAL DISPLAY DEVICE

CROSS-REFERENCE TO RELATED APPLICATION

The present application claims priority from Japanese application JP 2017-065238 filed on Mar. 29, 2017, the content of which is hereby incorporated by reference into this application.

TECHNICAL FIELD

The present invention relates to a manufacturing method of a liquid crystal display device.

BACKGROUND

Generally, a manufacturing method of a liquid crystal display device includes a step of manufacturing a thin-film transistor substrate, a step of manufacturing a color filter substrate, a step of bonding the substrates together, and a step of cutting the substrates thus bonded, into a size of a display panel. In the cutting step, generally, the thin-film transistor substrate and the color filter substrate are cut by a cutter. Also in the cutting step, a terminal portion formed on the thin-film transistor substrate to connect an electronic circuit is exposed in such a manner that a portion, overlapping the terminal portion in planar view, in the color filter substrate is cut (for example, see Unexamined Japanese Patent Publication No. 2004-118135).

In liquid crystal display devices with flexibility, which have been proposed in recent years, a thin-film transistor substrate and a color filter substrate each includes a flexible substrate made of a flexible material (for example, a polyimide-based resin material) rather than a glass substrate. In such a liquid crystal display device, since it is difficult to easily cut a flexible material by a cutter, unlike glass substrate, there is a possibility that the manufacturing process becomes complicated. When the flexible material is to be cut in such a manner that the cutter blade is stuck deeply into the flexible material, the breakage or disconnection occurs at the terminal portion disposed below the flexible material, which may result in manufacturing errors.

The present disclosure has been made in view of the above-mentioned problem, and an object thereof is to provide a manufacturing method capable of easily manufacturing a liquid crystal display device with flexibility.

SUMMARY

In one general aspect, the instant application describes a manufacturing method of a liquid crystal display device. The liquid crystal display device includes a first substrate and a second substrate each including a flexible board, the first substrate and the second substrate being disposed opposite each other, and a liquid crystal layer disposed between the first substrate and the second substrate. The manufacturing method includes a first step of forming the flexible board by forming, in a first region on a glass substrate, a first resin unit made of a first resin having a property of absorbing infrared light and forming, in a second region on the glass substrate, a second resin unit made of a second resin smaller in infrared absorptivity than the first resin; and a second step of, subsequent to the first step, irradiating the first resin unit with infrared light to cut a portion corresponding to the first region in the flexible board.

The above general aspect may include one or more of the following features. The manufacturing method may further include a third step of, subsequent to the second step, separating the glass substrate from the flexible board.

A slit is formed in the first resin unit.

The first region may be a region corresponding to an outside of an outer periphery of a display panel, and the second region may be a region located inside the outer periphery.

In the second step, the portion corresponding to the first region in the flexible board may be cut by causing volume expansion on the first resin unit due to infrared light absorption to generate a crack in the second resin unit formed on the first resin unit.

The first substrate may include a terminal to be connected to an electronic component. The first resin unit constituting a first flexible board included in the first substrate may be formed outside the terminal in planar view.

The first resin unit constituting a second flexible board included in the second substrate may be formed inside the first resin unit constituting the first flexible board in planar view.

In another general aspect, a manufacturing method of a liquid crystal display device includes a first substrate and a second substrate each including a flexible board, the first substrate and the second substrate being disposed opposite each other, and a liquid crystal layer disposed between the first substrate and the second substrate. The manufacturing method includes a first step of forming, in a first region on a glass substrate, a first separating unit having a slit and including a light absorption film having a property of absorbing ultraviolet light, and forming, in a second region on the glass substrate, a second separating unit made of a material identical to a material for the first separating unit, a second step of, subsequent to the first step, forming a flexible board made of a resin material on the first separating unit and the second separating unit; and a third step of, subsequent to the second step, irradiating the first separating unit and the second separating unit with ultraviolet light to separate the glass substrate from the flexible board, and cutting a portion corresponding to the first region in the flexible board.

The above general aspect may include one or more of the following features. In the third step, the glass substrate may be separated from the flexible substrate by irradiating the first separating unit and the second separating unit with the ultraviolet ray to crystallize the first separating unit and the second separating unit, and the portion corresponding to the first region in the flexible board may be cut by irradiating the first separating unit with the ultraviolet light to crystallize the first separating unit and by generating a stress concentration at an end of the slit.

The manufacturing method may further include a fourth step of, prior to the third step, forming a semiconductor layer unit having a slit, the semiconductor layer unit being made of a material identical to a material for a semiconductor layer constituting a thin-film transistor and being formed to overlap the first separating unit in planar view. In the third step, the glass substrate may be separated from the flexible substrate by irradiating the first separating unit and the second separating unit with the ultraviolet ray to crystallize the first separating unit and the second separating unit. The portion corresponding to the first region in the flexible board may be cut by irradiating the first separating unit and the semiconductor layer unit with the ultraviolet light to crystallize the first separating unit and the semiconductor layer unit and by generating a stress concentration at an end of the slit of each of the first separating unit and the semiconductor layer unit.

According to the manufacturing method of the liquid crystal display device according to the present disclosure, the liquid crystal display device with flexibility can be easily manufactured.

BRIEF DESCRIPTION OF THE DRAWINGS

FIG. 3 is a plan view showing a configuration of a pixel of a liquid crystal display device according to a present embodiment;

FIG. 15 is a diagram illustrating another manufacturing method of liquid crystal display device according to a present embodiment.

DETAILED DESCRIPTION

One embodiment of the present disclosure will be described below with reference to the accompanying drawings. In an embodiment of the present disclosure, a liquid crystal display device by a chip on glass (COG) technique is taken as an example; however, the present disclosure is not limited thereto. For example, a liquid crystal display device by a chip on film (COF) technique or a tape carrier package (TCP) technique may be used.

Figure 1A:
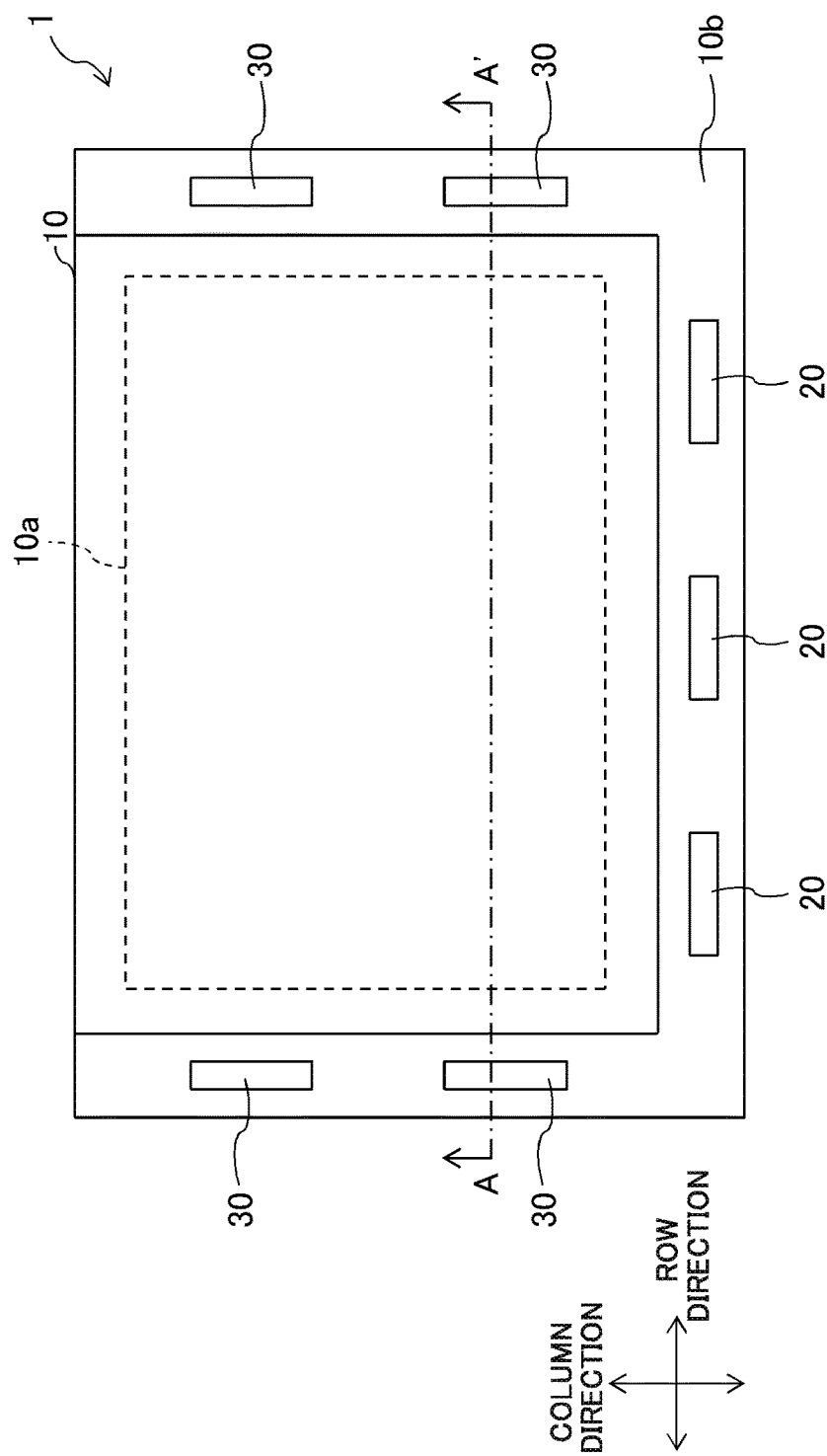
FIGS. 1A and 1B are respectively a plan view and a sectional view showing a schematic configuration of a liquid crystal display device according to a present embodiment.
Figure 1B:
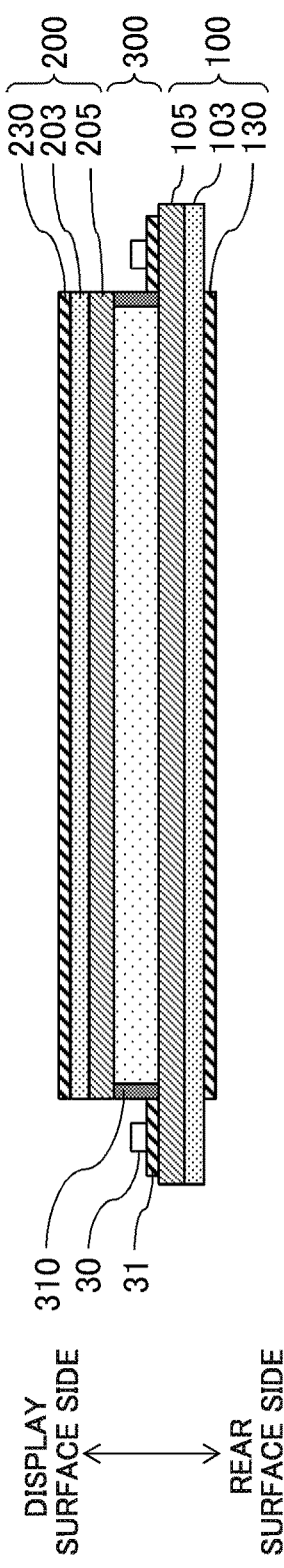

FIGS. 1A and 1B are respectively a plan view and a sectional view showing a schematic configuration of a liquid crystal display device according to the present embodiment. Liquid crystal display device 1 includes display panel 10, source driver ICs 20, gate driver ICs 30, and a backlight (not shown). Display panel 10 includes thin-film transistor substrate 100 (TFT substrate) (first substrate), color filter substrate 200 (CF substrate) (second substrate), and liquid crystal layer 300 sandwiched between the two substrates. Display panel 10 includes display region 10a for displaying an image, and non-display region 10b disposed around display region 10a. Source driver ICs 20 and gate driver ICs 30 are mounted on thin-film transistor substrate 100. The number of source driver ICs 20 and the number of gate driver ICs 30 are not limited.

FIG. 1B is the sectional view taken along line A-A' in FIG. 1A. Thin-film transistor substrate 100 includes flexible substrate 103 formed of a flexible material, TFT element layer 105 formed on a display surface side of flexible substrate 103, and polarizing plate 130 formed on a back surface side of flexible substrate 103. Terminal portion 31 as well as source driver ICs 20 and gate driver ICs 30 electrically connected to terminal portions 31 are disposed on non-display region 10b of TFT element layer 105. Color filter substrate 200 includes flexible substrate 203 formed of a flexible material, CF element layer 205 formed on a back surface side of flexible substrate 203, and polarizing plate 230 formed on a display surface side of flexible substrate 203. Liquid crystal layer 300 is disposed between thin-film transistor substrate 100 and color filter substrate 200, and seal member 310 is formed at a periphery of liquid crystal layer 300.

Figure 2:
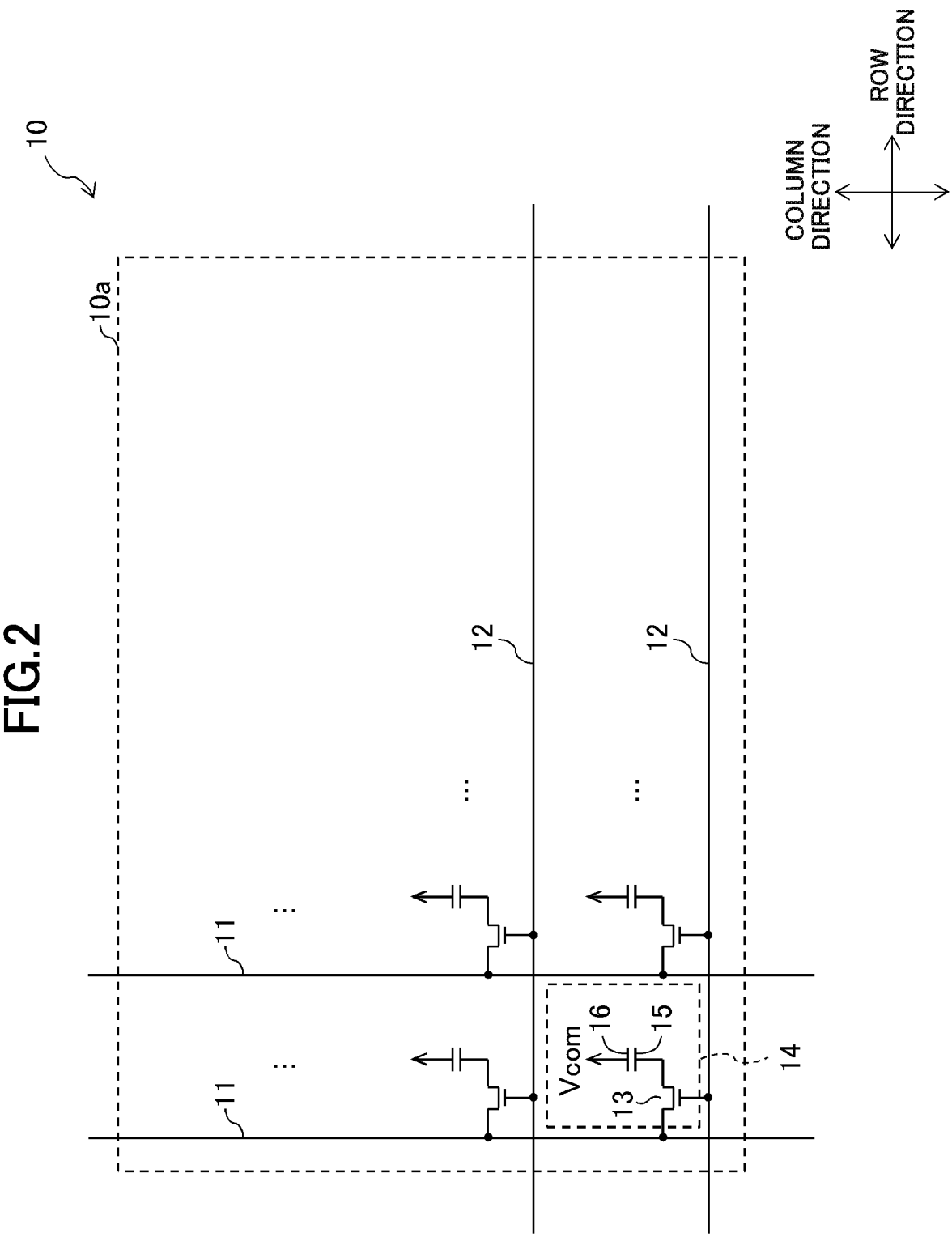
FIG. 2 is a plan view showing a schematic configuration of display region of display panel.

FIG. 2 is a plan view (equivalent circuit diagram) showing a schematic configuration of display region 10a of display panel 10. On display panel 10, a plurality of source lines 11 extending in a first direction (e.g., a column direction) and a plurality of gate lines 12 extending in a second direction (e.g., a row direction) are provided. Thin-film transistor 13 (TFT) is provided at an intersection of each source line 11 and each gate line 12. Source lines 11 are electrically connected to source driver ICs 20 (see FIGS. 1A, 1B), and gate lines 12 are electrically connected to gate driver ICs 30 (see FIGS. 1A, 1B).

Display panel 10 includes a plurality of pixels 14 arranged in a matrix arrangement (row and column directions) so as to correspond to the respective intersection of source lines 11 and gate lines 12. On thin-film transistor substrate 100, a plurality of pixel electrodes 15 disposed for respective pixel 14, and a common electrode 16 which is common to the plurality of pixels 14 are provided.

Data signal (data voltage) is supplied with source lines 11 from source driver ICs 20, and gate signal (gate-on voltage, gate-off voltage) is supplied with gate lines 12 from gate driver ICs 30. Common voltage Vcom is supplied with common electrode 16 from a common driver (not shown). When an ON voltage (gate-on voltage) of the gate signal is supplied with gate lines 12, thin-film transistors 13 connected to gate lines 12 are turned on, and the data voltage is supplied with pixel electrodes 15 via source lines 11 connected to thin-film transistors 13. An electric field is generated by a difference between the data voltage supplied to pixel electrodes 15 and common voltage Vcom supplied to common electrode 16. This electric field drives a liquid crystal and controls the light transmittance of the backlight so as to display an image. Color display is operated by supplying desired data voltages with source lines 11 connected to pixel electrodes 15 of pixels 14 corresponding to red, green, and blue formed of stripe-shaped color filters.

Figure 4:
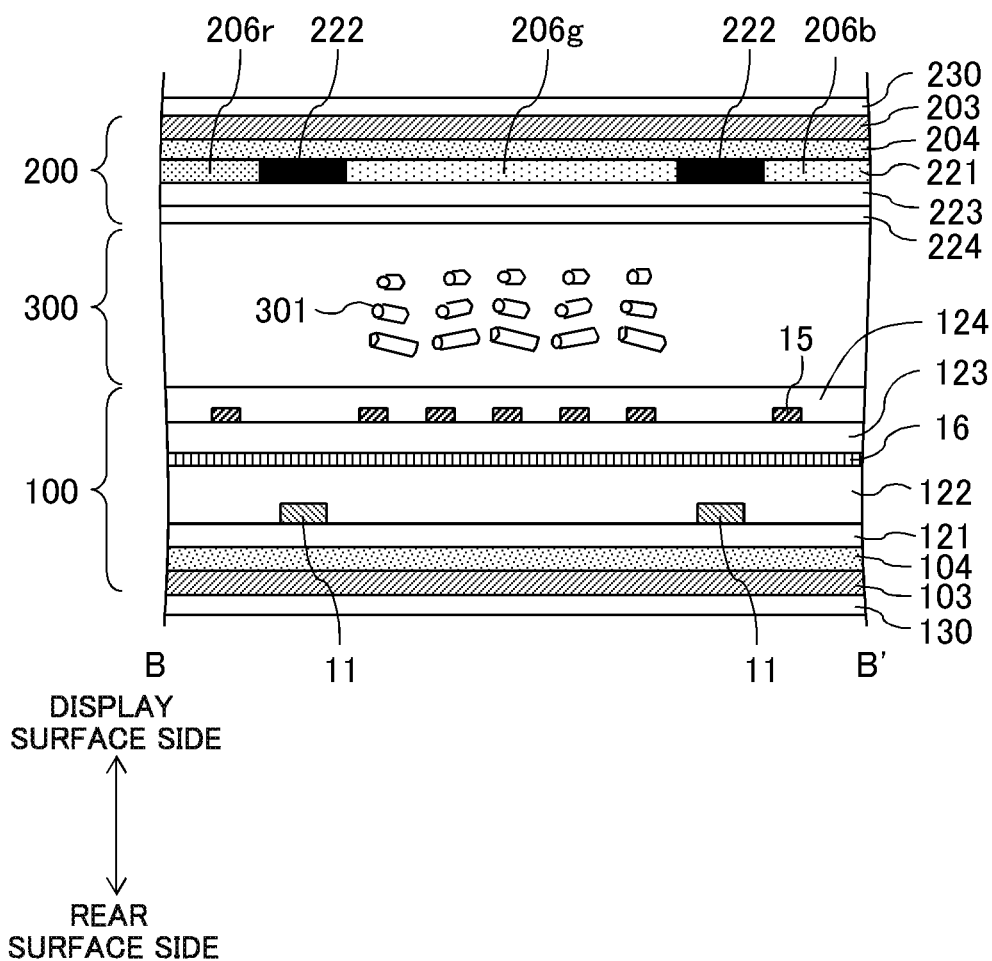
FIG. 4 is a sectional view taken along line B-B' in FIG. 3.
Figure 5:
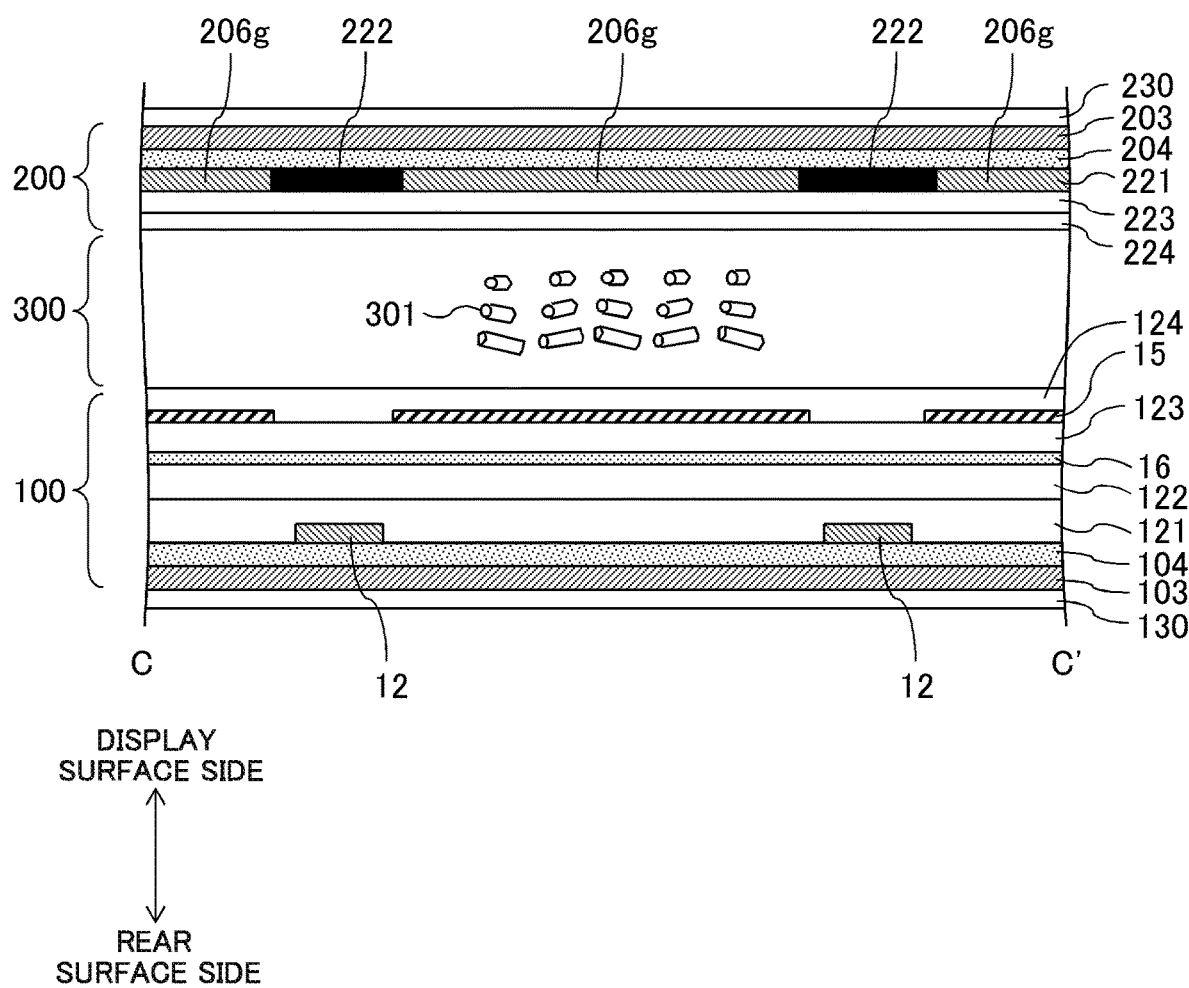
FIG. 5 is a sectional view taken along line C-C' in FIG. 3.

FIG. 3 is a plan view showing a configuration of each pixel 14. FIG. 4 is a sectional view taken along line B-B' in FIG. 3, and FIG. 5 is a sectional view taken along line C-C' in FIG. 3. With reference to FIGS. 3 to 5, a specific configuration of display panel 10 will be described.

In FIG. 3, a region defined by adjacent two of source lines 11 and adjacent two of gate lines 12 corresponds to one pixel 14. Thin-film transistors 13 are respectively provided in the pixels 14. As shown in FIG. 3, each of thin-film transistors 13 includes semiconductor layer 17 formed on insulating film 121 (see FIG. 4), and drain electrode 18 and source electrode 19 each formed on semiconductor layer 17. Drain electrodes 18 are electrically connected to source lines 11, and source electrodes 19 are electrically connected to pixel electrodes 15 through through-holes 21.

Each pixel electrode 15 formed of a transparent conductive film such as ITO or the like is formed in a pixel 14. The pixel electrode 15 has a plurality of openings (slits) formed in stripe shapes. In common to respective pixels 14, one common electrode 16 formed of a transparent conductive film such as ITO or the like is formed on entire display region. An opening in common electrode 16 for electrically connecting a pixel electrode 15 to a source electrode 19 is formed in a region overlapping through-holes 21 and source electrode 19 of thin-film transistors 13.

As shown in FIGS. 4 and 5, display panel 10 includes thin-film transistor substrate 100 disposed on the back surface side, color filter substrate 200 disposed on the display surface side, and liquid crystal layer 300 sandwiched between thin-film transistor substrate 100 and color filter substrate 200.

In thin-film transistor substrate 100, gate lines 12 (FIG. 5) are formed via diffusion preventing layer 104 on the display surface side of flexible substrate 103, and insulating film 121 is formed so as to cover gate lines 12. Source lines 11 (FIG. 4) are formed on insulating film 121, and insulating film 122 is formed so as to cover source lines 11. Common electrode 16 is formed on insulating film 122, and insulating film 123 is formed so as to cover common electrode 16. Pixel electrodes 15 are formed on insulating film 123, and alignment film 124 is formed so as to cover pixel electrodes 15. Polarizing plate 130 is formed on the back surface side of flexible substrate 103.

In color filter substrate 200, black matrixes 222 and color filters 206 (e.g., red color filter 206r, green color filter 206g, and blue color filter 206b) are formed through diffusion preventing layer 204 on the back surface side of flexible substrate 203, and overcoat layer 223 is formed so as to cover black matrixes 222 and color filters 206. Alignment film 224 is formed on overcoat layer 223. Polarizing plate 230 is formed on the display surface side of flexible substrate 203.

Liquid crystal 301 is sealed in liquid crystal layer 300. Liquid crystal 301 may be a negative-type liquid crystal of which the dielectric anisotropy is negative, or may be a positive-type liquid crystal of which the dielectric anisotropy is positive.

Each of alignment films 124 and 224 may be subjected to a rubbing alignment treatment or an optical alignment treatment.

Stacked layer structures of the respective components constituting each pixel 14 are not limited to the configurations shown in FIGS. 4 and 5. And known configurations can be applied thereto. As described above, liquid crystal display device 1 has the configuration by an in plane switching (IPS) technique. The configuration of liquid crystal display device 1 is not limited to the configuration described above.

Next, a manufacturing method of liquid crystal display device 1 will be described. The manufacturing method of liquid crystal display device 1 includes a thin-film transistor substrate manufacturing step of manufacturing thin-film transistor substrate 100 (first substrate), a color filter substrate manufacturing step of manufacturing color filter substrate 200 (second substrate), a substrate bonding step of bonding thin-film transistor substrate 100 and color filter substrate 200 together, a separating step of separating the glass substrate which is underlying, and a cutting step of cutting the substrates for each display panel 10 (liquid crystal cell).

Figure 6A:
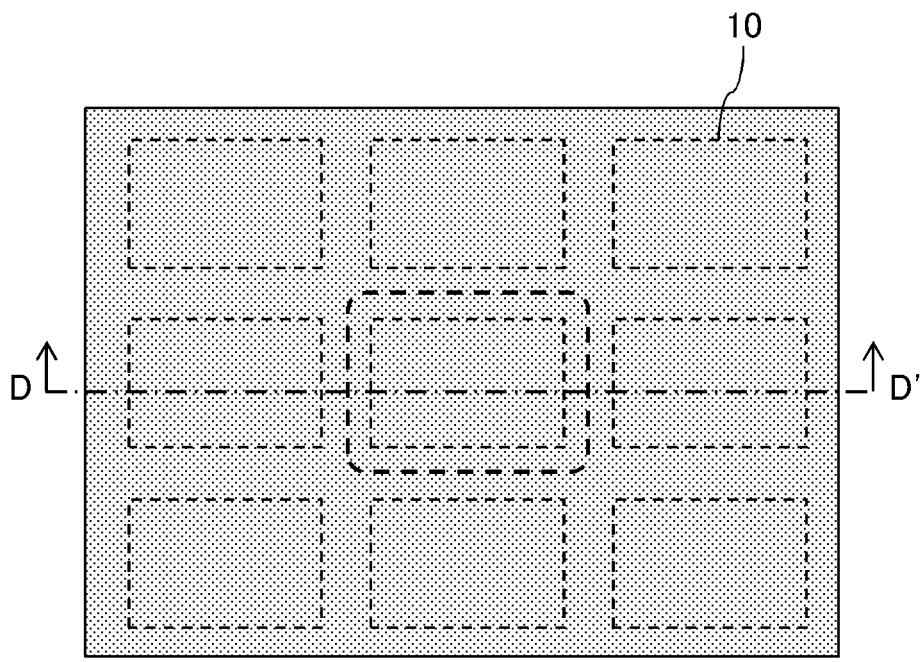
FIG. 6A is a plan view showing a state after the substrate bonding step of manufacturing method of the liquid crystal display device according to a present embodiment.
Figure 6B:
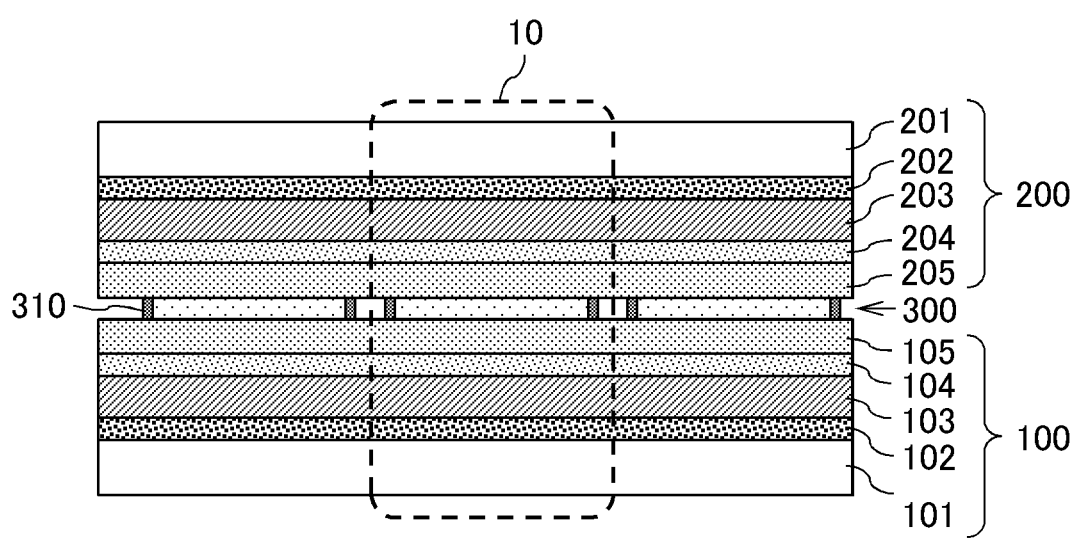
FIG. 6B is a sectional view taken along the line D-D' in FIG. 6A.
Figure 7:
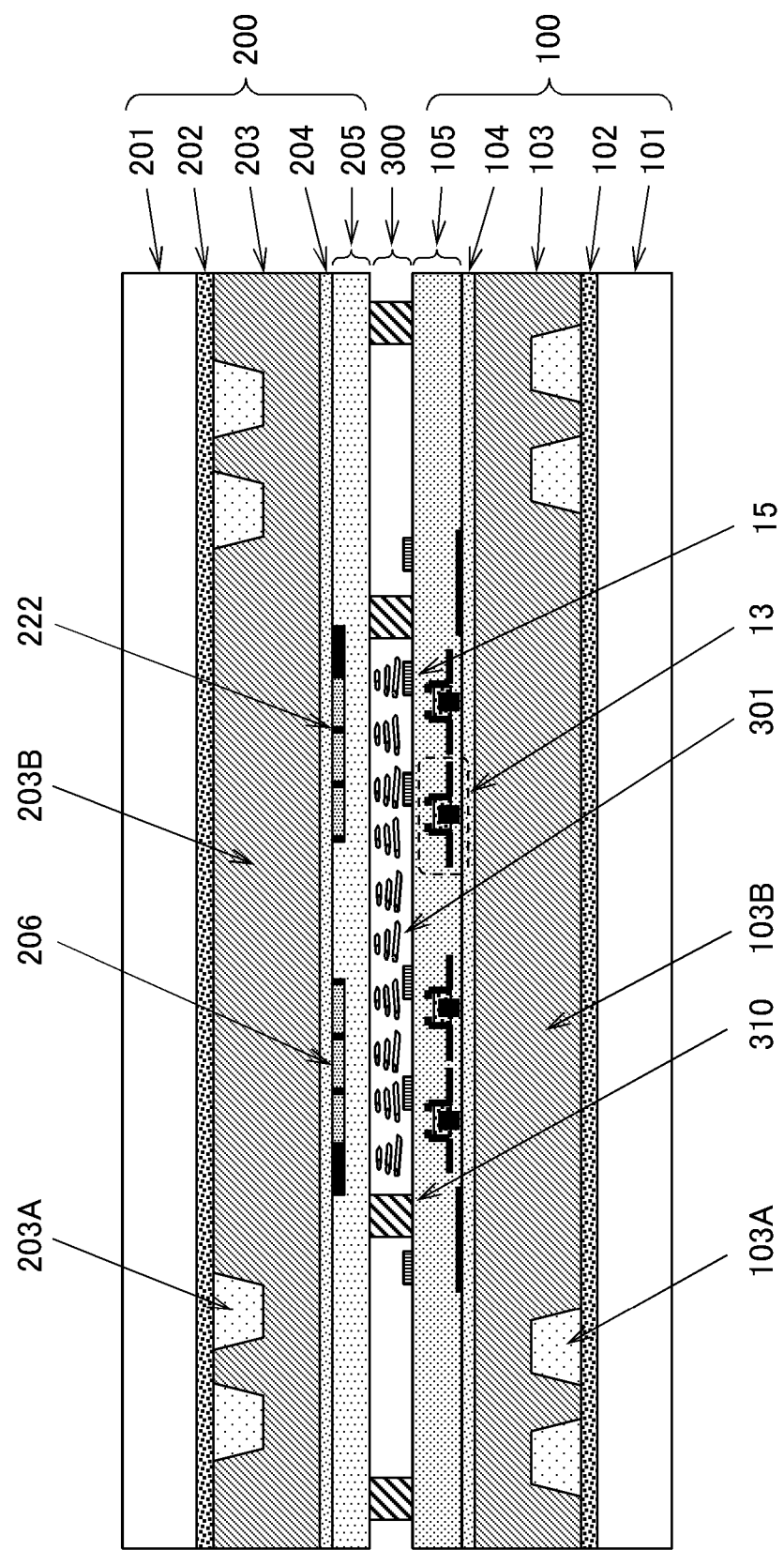
FIG. 7 is a sectional view showing a detailed configuration of FIG. 6B.

FIG. 6A is a plan view showing a state after the substrate bonding step, and FIG. 6B is a sectional view taken along line D-D' in FIG. 6A. The example shown in FIGS. 6A and 6B shows a process of manufacturing nine display panels 10. In the following, for convenience, a description is given with reference to one display panel 10 surrounded by the dotted line in FIGS. 6A and 6B. FIG. 7 is a sectional view showing a detailed configuration of FIG. 6B.

Figure 8:
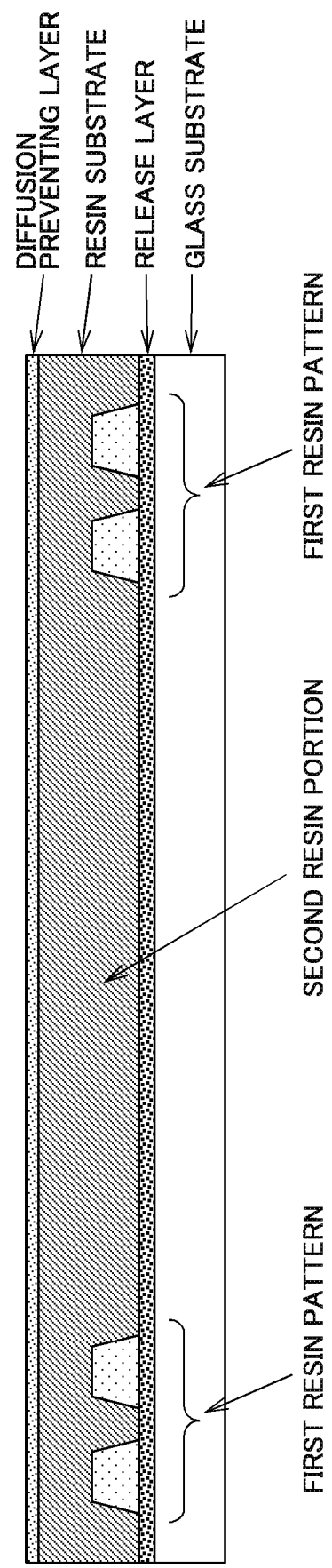
FIG. 8 is a diagram illustrating a manufacturing method of the liquid crystal display device according to the present embodiment.

In the thin-film transistor substrate manufacturing step and the color filter substrate manufacturing step, first, as shown in FIG. 8, a light absorbing film having a property of absorbing ultraviolet rays or near-ultraviolet rays, such as a-Si or a-Ge, is formed on a glass substrate (mother glass) by any of a CVD method, a sputtering method, a coating and baking method and the like, to form a separating layer. The separating layer is made of a-Si, a-Ge, or the like, and has a property of absorbing ultraviolet rays or near-ultraviolet rays to cause a volume change or a structural change rapidly. Next, a first resin pattern (first resin portion) in a band shape or a grid pattern is formed by a resin (first resin) containing an acrylic resin as a main component so as to surround a region corresponding to the outer periphery of liquid crystal display device 1 (display panel 10). The first resin has a property of absorbing infrared rays such as an organic material, for example. The method for forming the first resin pattern is not particularly limited. For example, a method by a photolithography process using a photosensitive resin and a predetermined mask or a method of directly drawing a non-photosensitive resin by an ink jet, a dispenser, or the like may be employed. After baking the first resin pattern, a second resin portion is formed on the glass substrate on which the separating layer is formed, by coating and baking a resin (second resin) containing a polyimide resin as a main component which would result in a resin substrate (flexible substrate) at the time of completion. The second resin portion absorbs smaller infrared ray than the first resin. Since the glass substrate serves for supporting the resin substrate, a glass substrate having a thickness of 0.5 mm to 1.0 mm is used. The thickness of the separating layer is set to 50 nm to 400 nm, the thickness of the first resin pattern is set to 2 μm to 10 μm, and the thickness of the second resin portion is set to 50 μm to 200 μm. As described above, the first resin pattern has a slit and is embedded in the second resin portion.

Next, a diffusion preventing layer such as SiN film is formed on a surface of the second resin portion to prevent moisture, ionic impurities and the like from entering TFT element layer 105 and CF element layer 205.

Figure 9:
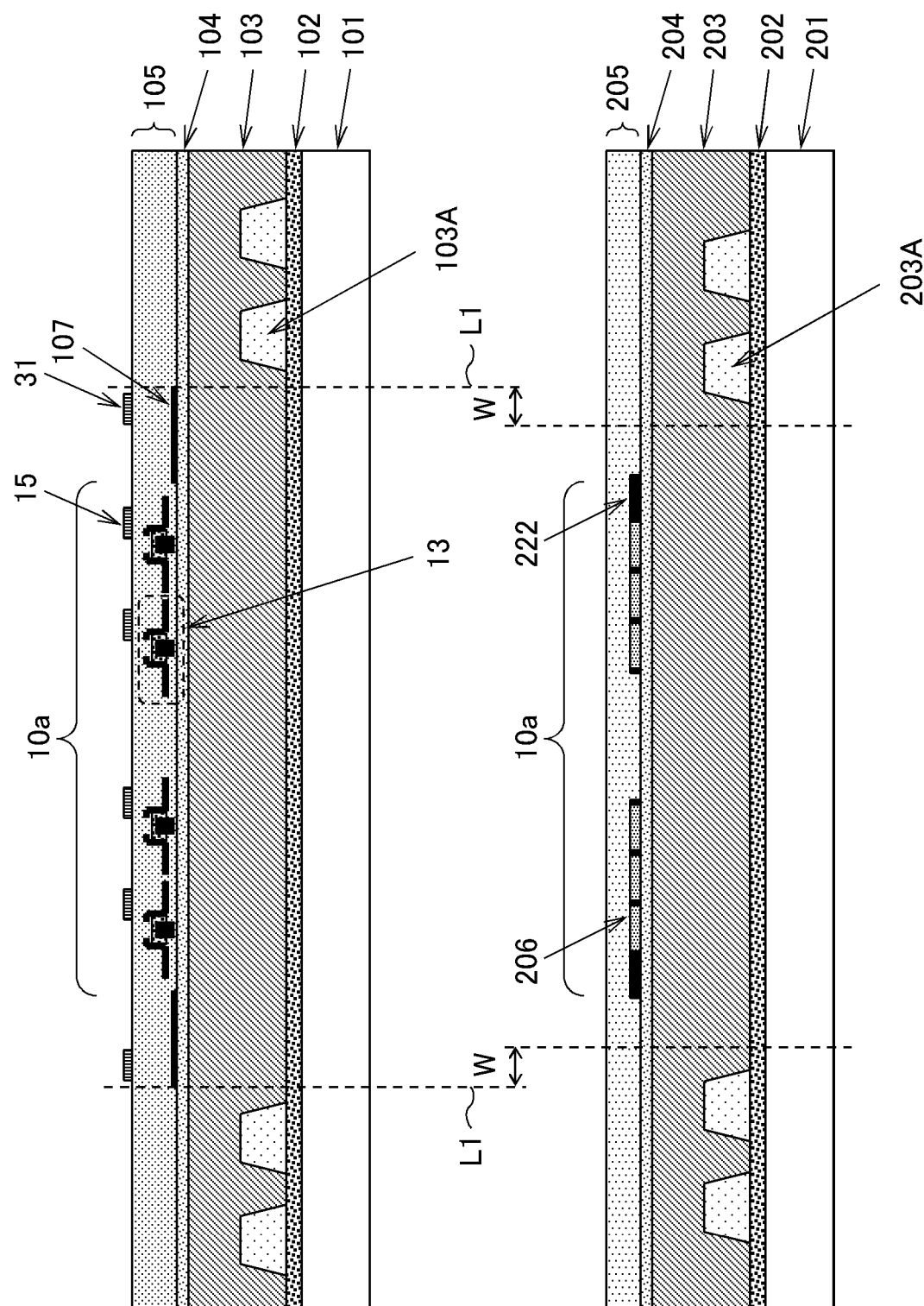
FIGS. 9A and 9B are diagrams illustrating a manufacturing method of the liquid crystal display device according to the present embodiment.

In the thin-film transistor substrate manufacturing step, subsequent to the step shown in FIG. 8, as shown in FIG. 9A, TFT element layer 105 is formed on the substrate shown in FIG. 8. TFT element layer 105 includes the structural members (source lines 11, gate lines 12, thin-film transistors 13, pixel electrodes 15, common electrode 16, and the like) shown in, for example, FIGS. 4 and 5. Thin-film transistors 13 are formed by, for example, a vacuum process or a coating process using an organic material. Terminal portion 31 is formed on the non-display region 10B (see FIG. 1A)

on TFT element layer 105. Terminal portion 31 overlaps lead wire 107 in planar view, and is electrically connected to lead wire 107 through a through-hole (not shown). First resin pattern 103A is formed on a region located outside ends (shown by dotted lines L1 in FIG. 9A) of terminal portion 31 and lead wire 107 in planar view. Through the steps described above, thin-film transistor substrate 100 is manufactured.

In the color filter substrate manufacturing step, subsequent to the step shown in FIG. 8, as shown in FIG. 9B, CF element layer 205 is formed on the substrate shown in FIG. 8. CF element layer 205 includes the structural members (color filters 206, black matrixes 222, and the like) shown in, for example, FIGS. 4 and 5. First resin pattern 203A is formed at a position (inward) closer to display region 10a than first resin pattern 103A such that a region (region W in FIG. 9B) is exposed, the region overlapping terminal portion 31 in planar view, when thin-film transistor substrate 100 and CF element layer 205 are bonded together. Through the steps described above, color filter substrate 200 is manufactured.

Figure 10:
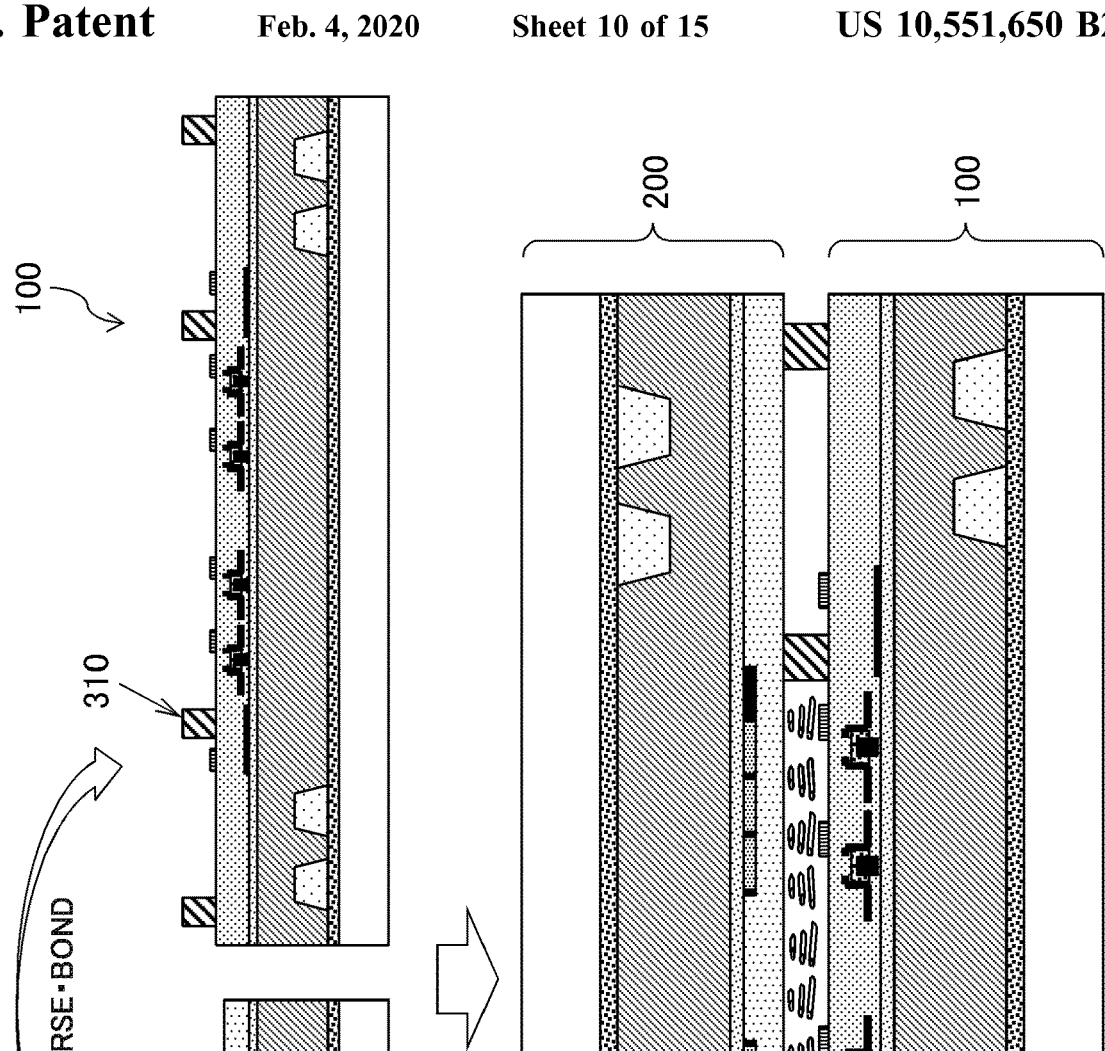
FIGS. 10A, 10B and 10C are diagrams illustrating a manufacturing method of the liquid crystal display device according to the present embodiment.

In the substrate bonding step, first, an alignment film (see FIGS. 4, 5) is coated to each of a surface of thin-film transistor substrate 100 manufactured through the thin-film transistor substrate manufacturing step and a surface of color filter substrate 200 manufactured through the color filter substrate manufacturing step. After being coated, the alignment are then baked. Thereafter, seal member 310 is provided to a predetermined position of thin-film transistor substrate 100 (FIG. 10B), and liquid crystal 301 is dropped onto display region 10a on color filter substrate 200 (see FIGS. 1A, 1B) (FIG. 10A). Next, thin-film transistor substrate 100 and color filter substrate 200 are bonded together, and seal member 310 is irradiated with ultraviolet rays and is thus cured (FIG. 10C).

Figure 11:
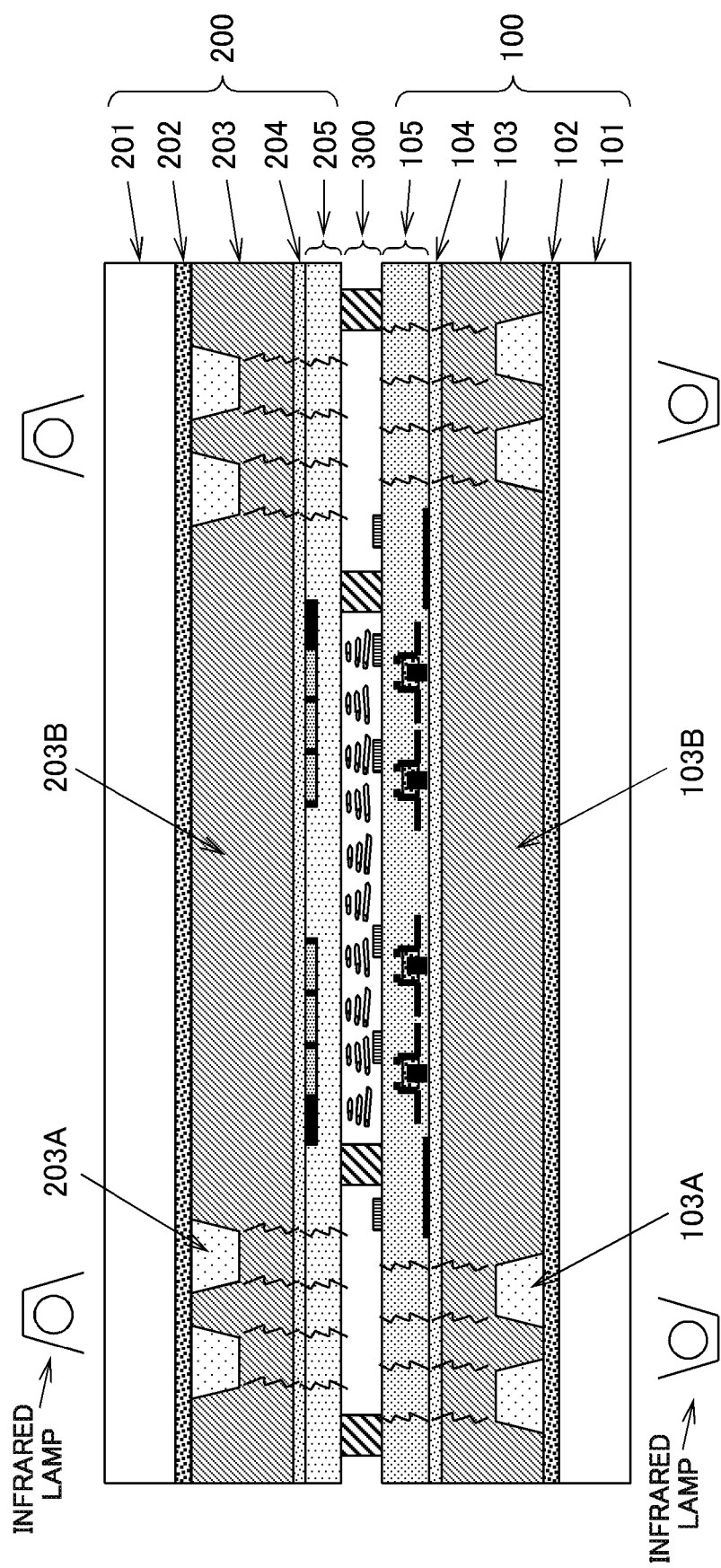
FIG. 11 is a diagram illustrating a manufacturing method of the liquid crystal display device according to the present embodiment.

In the cutting step, as shown in FIG. 11, first resin pattern 103A of thin-film transistor substrate 100 and first resin pattern 203A of color filter substrate 200 are irradiated with infrared rays. The process of irradiating infrared rays may be performed by an infrared lamp or an infrared laser. Infrared ray absorption of first resin patterns 103A and 203A causes volume expansion or embrittlement, and eventually cracks are generated in second resin portions 103B and 203B on first resin patterns 103A and 203A. Accordingly, each of thin-film transistor substrate 100 and color filter substrate 200 is easily cut and separated at portions corresponding to the cracks.

Figure 12:
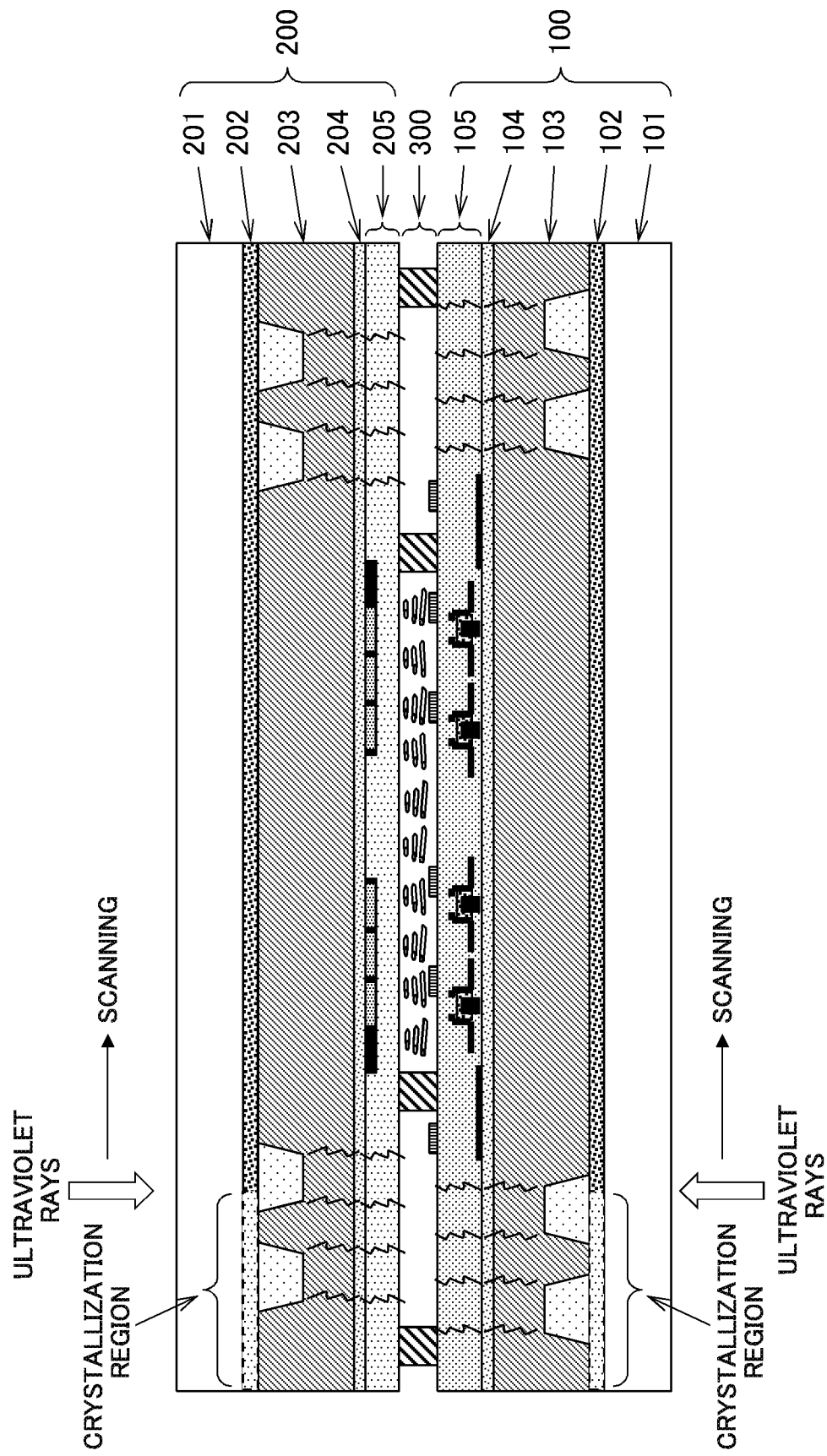
FIG. 12 is a diagram illustrating a manufacturing method of the liquid crystal display device according to the present embodiment.

In the separating step, as shown in FIG. 12, line-shaped light (e.g., ultraviolet rays) is scanned from glass substrate 101 of thin-film transistor substrate 100 and glass substrate 201 of color filter substrate 200, so that separating layers 102 and 202 (light absorption films) formed between glass substrates 101 and 201 and flexible substrates 103 and 203 are crystallized. The line-shaped light is light (coherent light) with high light directivity like a laser beam and with high energy density preferably, and is light having a wavelength in a range from 250 nm to 350 nm preferably. Since the light absorbing film causes a structural change (contraction) upon crystallization to generate an internal strain, separating layers 102 and 202 are respectively separated from flexible substrates 103 and 203. Glass substrates 101 and 201 are thus separated. Terminal portion 31 is exposed on thin-film transistor substrate 100. Electronic components (e.g., gate driver ICs 30) are mounted on terminal portion 31.

Figure 13:
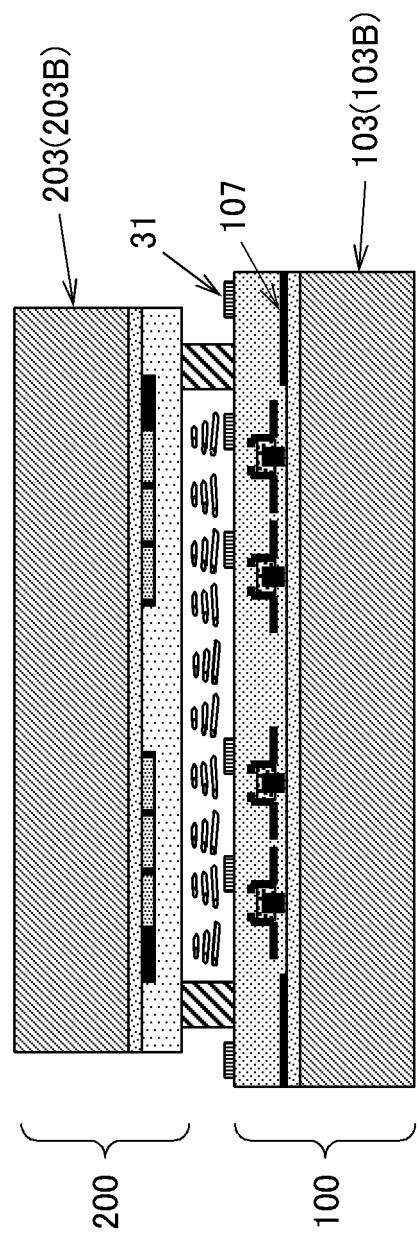
FIG. 13 is a diagram illustrating a manufacturing method of the liquid crystal display device according to the present embodiment.

Through the steps described above, liquid crystal display device 1 (liquid crystal cell) with flexibility is completed as shown in FIG. 13. Liquid crystal display device 1 includes second resin portions 103B and 203B as base members (flexible substrates).

As described above, in the manufacturing method described above, the resins (first resin patterns 103A, 203A) which has larger absorbency of infrared ray than the resins (second resin portions 103B, 203B) constituting the base members (flexible substrates 103, 203) are formed in advance in the portions along which thin-film transistor substrate 100 and color filter substrate 200 would be cut. Thereafter, when first resin patterns 103A and 203A are irradiated with infrared rays, first resin patterns 103A and 203A heated by absorption of infrared rays cause a structural change. As a result, cracks are generated in second resin portion 103B and TFT element layer 105 on first resin pattern 103A and in second resin portion 203B and CF element layer 205 on first resin pattern 203A. Thus, a part of thin-film transistor substrate 100 and color filter substrate 200 is easily cut and separated. Therefore, liquid crystal display device 1 with flexibility can be manufactured easily, and it is possible to prevent manufacturing errors.

Figure 14:
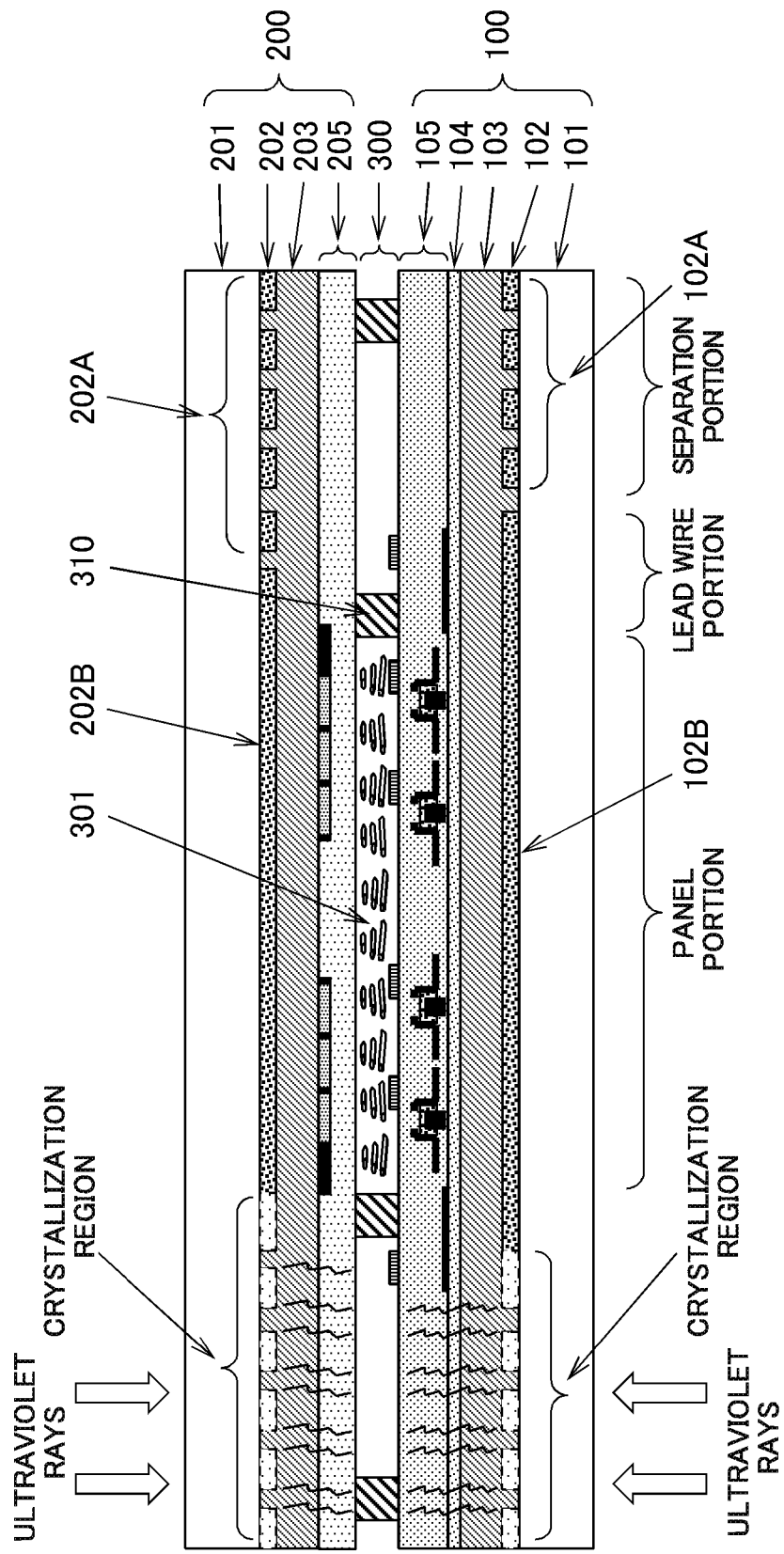
FIG. 14 is a diagram illustrating a manufacturing method of the liquid crystal display device according to the present embodiment.

The present disclosure is not limited to the manufacturing method described above. FIG. 14 is a diagram showing another manufacturing method of liquid crystal display device 1. In the manufacturing method shown in FIG. 14, separating layer patterns 102A and 202A (first separating portions) are formed at a position (separation portion) where thin-film transistor substrate 100 and color filter substrate 200 are cut and separated, and second separating portions 102B and 202B are formed in a region corresponding to a panel portion inside the separation portion. Separating layer patterns 102A and 202A are formed in an island shape or a line shape. Each of separating layer patterns 102A and 202A has a slit. Each flexible substrate 103 or 203 does not include first resin pattern 103A 203A (see FIG. 7). In the manufacturing method shown in FIG. 14, for example, ultraviolet rays is irradiated from back surface sides of thin-film transistor substrate 100 and color filter substrate 200, so that the separating layers (second separating portions 102B, 202B) made of a-Si, for example, are crystallized. Second separating portions 102B and 202B causes a rapid structural change in order to generate an internal strain, so that the resin substrates (flexible substrates 103, 203) are respectively separated from glass substrates 101 and 201 at the panel portion. On the other hand, in the separation portion where separating layer patterns 102A, 202A are formed, stress concentration occurs at ends (edges) of the slits in the separating layer patterns 102A, 202A, and cracks are generated in the resin substrates (flexible substrates 103, 203) upon crystallization. A part of thin-film transistor substrate 100 and color filter substrate 200 is thus cut and separated.

FIG. 15 is a diagram showing another manufacturing method of liquid crystal display device 1. In the manufacturing method shown in FIG. 15, in thin-film transistor substrate 100 shown in FIG. 14, semiconductor layer pattern 120 (semiconductor layer portion) is further formed at a position (separation portion) where thin-film transistor substrate 100 and color filter substrate 200 are cut and separated. Semiconductor layer pattern 120 is formed in an island shape or a line shape. Semiconductor layer pattern 120 has a slit. Semiconductor layer pattern 120 is made of a material having a property of absorbing ultraviolet rays or near-ultraviolet rays to rapidly cause a volume change or a structural change. For example, the material is the same as a material of which semiconductor layer 17 (see FIG. 3) included in thin-film transistor 13 is made. According to the manufacturing method shown in FIG. 15, particularly in thin-film transistor substrate 100, semiconductor layer pattern 120 on separating layer pattern 102 A is also crystallized. As compared with the manufacturing method shown in FIG. 14, therefore, cracks are easily generated in the resin substrate (flexible substrate 103), so that a part of thin-film transistor substrate 100 can be easily cut and separated.

While there have been described what are at present considered to be certain embodiments of the application, it will be understood that various modifications may be made thereto, and it is intended that the appended claims cover all such modifications as fall within the true spirit and scope of the invention.

What is claimed is:

1. A manufacturing method of a liquid crystal display device including a first substrate and a second substrate each including a flexible board, the first substrate and the second substrate being disposed opposite each other, and a liquid crystal layer disposed between the first substrate and the second substrate, the manufacturing method comprising:
    a first step of forming the flexible board included in either the first substrate or the second substrate by forming a first resin unit made of a first resin having a property of absorbing infrared light in a first region on a glass substrate and forming a second resin unit made of a second resin smaller in infrared absorptivity than the first resin in a second region on the glass substrate; and
    a second step of, subsequent to the first step, irradiating the first resin unit with infrared light to cut a portion corresponding to the first region in the flexible board, wherein
    in the second step, the portion corresponding to the first region in the flexible board is cut by causing volume expansion on the first resin unit due to infrared light absorption to generate a crack in the second resin unit formed on the first resin unit.

2. The manufacturing method according to claim 1, further comprising
    a third step of, subsequent to the second step, separating the glass substrate from the flexible board.

3. The manufacturing method according to claim 1, wherein
    a slit is formed in the first resin unit.

4. The manufacturing method according to claim 1, wherein
    the first region is a region corresponding to an outside of an outer periphery of a display panel, and the second region is a region located inside the outer periphery.

5. A manufacturing method of a liquid crystal display device including a first substrate and a second substrate each including a flexible board, the first substrate and the second substrate being disposed opposite each other, and a liquid crystal layer disposed between the first substrate and the second substrate, the manufacturing method comprising:
    a first step of forming, in a first region on a glass substrate, a first separating unit having a slit and including a light absorption film having a property of absorbing ultraviolet light, and forming, in a second region on the glass substrate, a second separating unit made of a material identical to a material for the first separating unit;
    a second step of, subsequent to the first step, forming a flexible board made of a resin material on the first separating unit and the second separating unit; and
    a third step of, subsequent to the second step, irradiating the first separating unit and the second separating unit with ultraviolet light to separate the glass substrate from the flexible board, and cutting a portion corresponding to the first region in the flexible board.

6. The manufacturing method according to claim 5, wherein
    in the third step,
    the glass substrate is separated from the flexible substrate by irradiating the first separating unit and the second separating unit with the ultraviolet ray to crystallize the first separating unit and the second separating unit, and
    the portion corresponding to the first region in the flexible board is cut by irradiating the first separating unit with the ultraviolet light to crystallize the first separating unit and by generating a stress concentration at an end of the slit.

7. The manufacturing method according to claim 5, further comprising
    a fourth step of, prior to the third step, forming a semiconductor layer unit having a slit, the semiconductor layer unit being made of a material identical to a material for a semiconductor layer constituting a thin-film transistor and being formed to overlap the first separating unit in planar view,
    wherein
    in the third step,
    the glass substrate is separated from the flexible substrate by irradiating the first separating unit and the second separating unit with the ultraviolet ray to crystallize the first separating unit and the second separating unit, and
    the portion corresponding to the first region in the flexible board is cut by irradiating the first separating unit and the semiconductor layer unit with the ultraviolet light to crystallize the first separating unit and the semiconductor layer unit and by generating a stress concentration at an end of the slit of each of the first separating unit and the semiconductor layer unit.

8. A manufacturing method of a liquid crystal display device including a first substrate and a second substrate each including a flexible board, the first substrate and the second substrate being disposed opposite each other, and a liquid crystal layer disposed between the first substrate and the second substrate, the manufacturing method comprising:
    a first step of forming the flexible board included in either the first substrate or the second substrate by forming a first resin unit made of a first resin having a property of absorbing infrared light in a first region on a glass substrate and forming a second resin unit made of a second resin smaller in infrared absorptivity than the first resin in a second region on the glass substrate; and
    a second step of, subsequent to the first step, irradiating the first resin unit with infrared light to cut a portion corresponding to the first region in the flexible board, wherein
    the first substrate includes a terminal to be connected to an electronic component,
    the first resin unit constituting a first flexible board included in the first substrate is formed outside the terminal in planar view, and
    the first resin unit constituting a second flexible board included in the second substrate is formed inside the first resin unit constituting the first flexible board in planar view.

9. The manufacturing method according to claim 8, further comprising
    a third step of, subsequent to the second step, separating the glass substrate from the flexible board.

10. The manufacturing method according to claim 8, wherein
   a slit is formed in the first resin unit.

11. The manufacturing method according to claim 8, wherein
   the first region is a region corresponding to an outside of an outer periphery of a display panel, and the second region is a region located inside the outer periphery.

* * * * *